United States Patent
Sinha K. et al.

(10) Patent No.: US 9,876,135 B2
(45) Date of Patent: Jan. 23, 2018

(54) METHOD FOR FORMING COPPER METALLIZATION OVER TCO OF SOLAR CELLS

(71) Applicants: Ashok Sinha K., Los Altos Hill, CA (US); Roman Milter, Alviso, CA (US); Robert Broesler, San Francisco, CA (US)

(72) Inventors: Ashok Sinha K., Los Altos Hill, CA (US); Roman Milter, Alviso, CA (US); Robert Broesler, San Francisco, CA (US)

(73) Assignee: SUNPREME, Sunnyvale, CA (US)

( * ) Notice: Subject to any disclaimer, the term of this patent is extended or adjusted under 35 U.S.C. 154(b) by 0 days.

(21) Appl. No.: 15/430,459

(22) Filed: Feb. 11, 2017

(65) Prior Publication Data

US 2017/0162744 A1 Jun. 8, 2017

Related U.S. Application Data

(60) Continuation of application No. 14/710,252, filed on May 12, 2015, now Pat. No. 9,577,140, which is a division of application No. 13/299,752, filed on Nov. 18, 2011, now abandoned.

(51) Int. Cl.
| | |
|---|---|
| H01L 21/00 | (2006.01) |
| H01L 31/18 | (2006.01) |
| H01L 31/02 | (2006.01) |
| H01L 31/0747 | (2012.01) |
| H01L 31/0224 | (2006.01) |
| H01L 31/0236 | (2006.01) |
| H01L 31/20 | (2006.01) |

(52) U.S. Cl.
CPC ...... *H01L 31/1884* (2013.01); *H01L 31/0201* (2013.01); *H01L 31/02366* (2013.01); *H01L 31/022466* (2013.01); *H01L 31/0747* (2013.01); *H01L 31/202* (2013.01)

(58) Field of Classification Search
CPC ......... H01L 31/1884; H01L 31/022433; H01L 31/022466; H01L 31/02366; H01L 31/1804; H01L 31/186
USPC ...................................................... 438/71, 96
See application file for complete search history.

(56) References Cited

U.S. PATENT DOCUMENTS

| | | | | |
|---|---|---|---|---|
| 5,793,149 A * | 8/1998 | Thiel | ......... | B41J 2/161 310/324 |
| 6,429,120 B1 * | 8/2002 | Ahn | ......... | C23C 14/3471 438/635 |
| 2003/0127734 A1 * | 7/2003 | Lee | ......... | H01L 24/11 257/737 |
| 2007/0031758 A1 * | 2/2007 | Nishikawa | ......... | G03F 7/0392 430/270.1 |
| 2009/0068458 A1 * | 3/2009 | Yang | ......... | H05K 3/007 428/354 |

(Continued)

*Primary Examiner* — Vu A Vu
(74) *Attorney, Agent, or Firm* — Joseph Bach

(57) ABSTRACT

Methods for fabricating busbar and finger metallization over TCO are disclosed. Rather than using expensive and relatively resistive silver paste, a high conductivity and relatively low cost copper is used. Methods for enabling the use of copper as busbar and fingers over a TCO are disclosed, providing good adhesion while preventing migration of the copper into the TCO. Also, provisions are made for easy soldering contacts to the copper busbars.

20 Claims, 5 Drawing Sheets

(56) References Cited

U.S. PATENT DOCUMENTS

| | | | |
|---|---|---|---|
| 2010/0013037 A1* | 1/2010 | Park | H01L 31/022425 257/431 |
| 2010/0065101 A1* | 3/2010 | Zaban | H01G 9/2031 136/244 |
| 2010/0229928 A1* | 9/2010 | Zuniga | H01L 31/1804 136/255 |
| 2011/0114171 A1* | 5/2011 | Meier | H01L 31/02168 136/256 |
| 2011/0277825 A1* | 11/2011 | Fu | H01L 31/022425 136/255 |

* cited by examiner

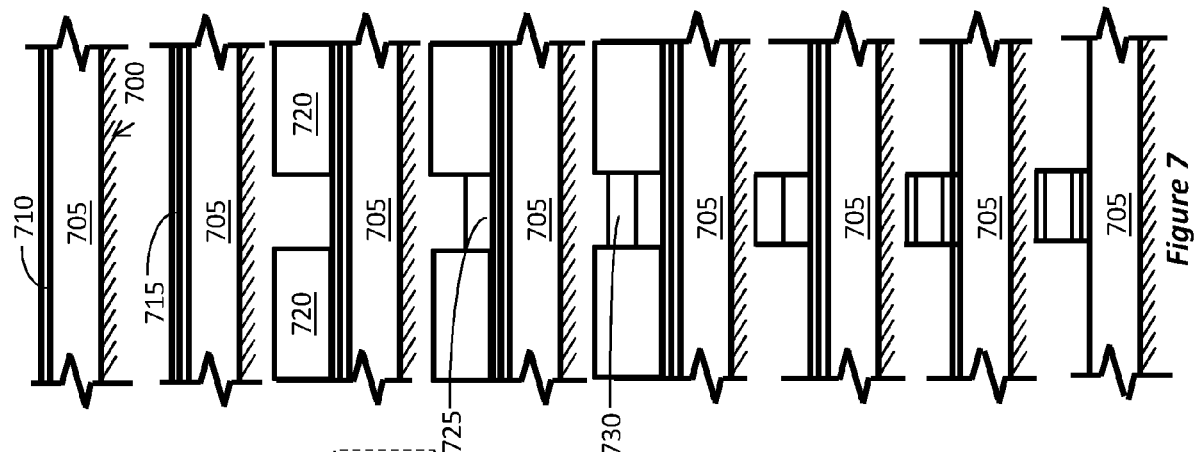
*Figure 7*
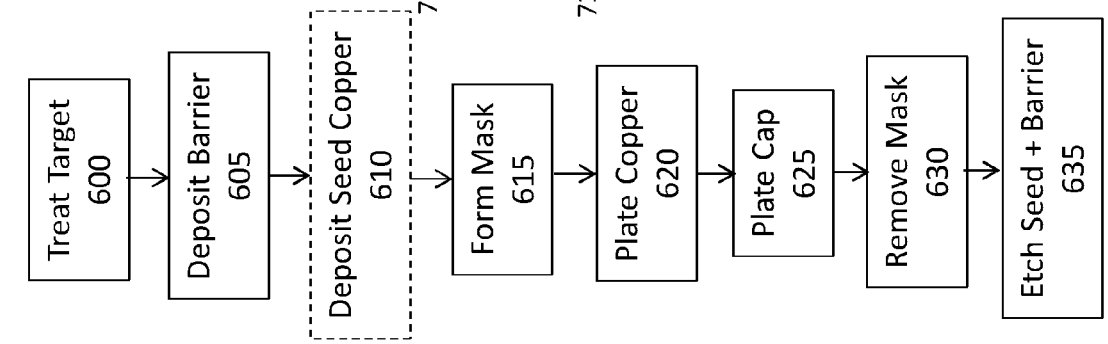
*Figure 6*
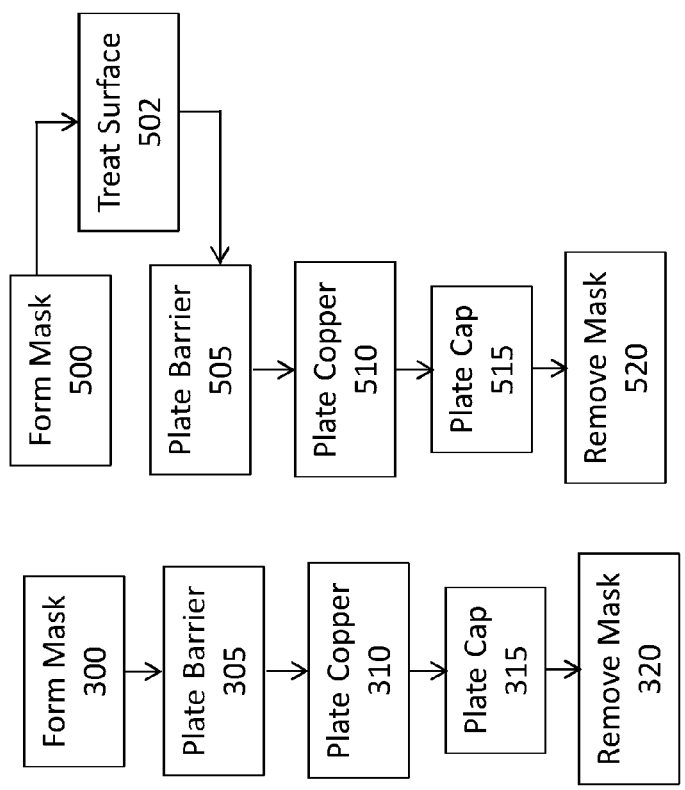
*Figure 5*
*Figure 3*
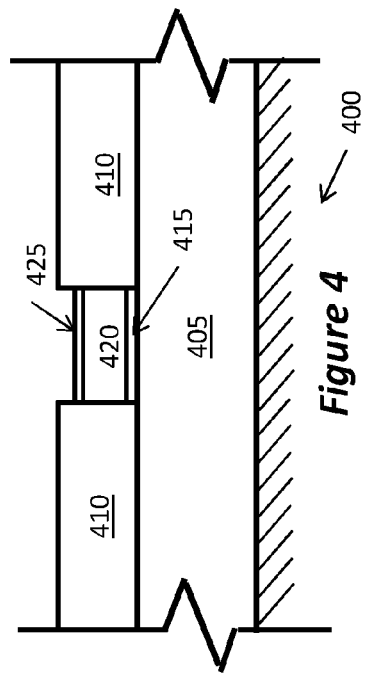
*Figure 4*

US 9,876,135 B2

METHOD FOR FORMING COPPER METALLIZATION OVER TCO OF SOLAR CELLS

RELATED APPLICATIONS

This Application is a continuation of and claims priority from application Ser. No. 14/710,252, filed May 12, 2015, which is a divisional of and claims priority from application Ser. No. 13/299,752, filed Nov. 18, 2011.

BACKGROUND

1. Field of the Invention

The subject invention relates to solar photovoltaic cells and, more specifically, to method for manufacturing low cost metallization layers for such cells and the resulting cell device structure.

2. Related Art

The silkscreen, silver-paste metallization technology has been developed mainly by the "traditional" diffused junction solar cell manufacturers. In such cells, a top layer of silicon nitride is used and then the metallization is formed on top of the silicon nitride. However, electrical contact must be made between the metallization and the emitter—through the silicon nitride layer. Therefore, silkscreen is used to deposit the silver paste and then the cell is annealed at high temperature (e.g., 950° C.) so that the silver paste diffuses through the silicon nitride layer and makes contact to the emitter. Since diffused-junction solar cells make the bulk of the solar market (by a very large margin), silver-paste technology became a de facto standard in the solar cell industry and much of the manufacturing and development efforts are directed at improving the conductivity of the resulting metallization using silver paste.

A specific metallization layer that is particularly relevant to the subject invention is busbar and fingers over a transparent conductive oxide (TCO). One solar cell architecture that incorporates a silver busbar and fingers over TCO is known as the HIT cell, available from Sanyo® of Japan. FIG. 1 illustrates the general structure of the HIT module. A high quality (Czochralski grown) single crystal silicon wafer of n-type is used as the substrate 100. The substrate 100 is about 200 micron thick and a square of about 125 mm by 125 mm. The substrate surfaces are texturized to form pyramid shapes throughout the surface, but this is not shown in FIG. 1 due to the minute size of the pyramids. The top surface is coated with a thin layer of an amorphous intrinsic silicon layer 105. A thin layer 110 of amorphous p-type silicon is deposited over the intrinsic layer 105. A layer of TCO 115, e.g., $ZnO_2$, ITO (Indium Tin Oxide), or InSnO, is deposited over the p-type layer. Then, busbar 120 and fingers 125 are fabricated over the TCO, generally by silk screen followed with anneal. The same is done on the bottom surface, wherein an i-layer 130, p-layer 135, and TCO layer 140 are deposited on the bottom surface, followed by busbar 145 and fingers (not visible in FIG. 1). The HIT cell, while being of relatively high efficiency (currently available at about 20% efficiency) is very expensive to manufacture. While part of the cost being the high grade silicon substrate used, other part of the cost is the high cost of the silver paste-based busbar and fingers. Additionally, the silver paste-based busbar and fingers pose a reliability problem in that they tend to delaminate with time.

FIG. 2 illustrate another structure, known as SmartSilicon®, and available from Sunpreme of Sunnyvale, Calif. A rather "dirty" metallurgical grade silicon (MG silicon) is used for fabricating substrate 200, using casting and solidification technique. Metallurgical grade silicon is generally of 3-5 "nines" purity, meaning 99.9%-99.999% pure, compared to Czochralski grown substrates, which are of nine-nines purity and even higher. Metallurgical grade silicon is generally used in the manufacture of aluminium-silicon alloys to produce cast parts, mainly for the automotive industry. It is also added to molten cast iron as ferrosilicon or silicocalcium alloys to improve its performance in casting thin sections, and to prevent the formation of cementite at the surface. MG silicon has been thought to be useless for semiconductor and solar applications. See, e.g., Towards Solar Grade Silicon: Challenges and Benefits for Low Cost Photovoltaics, Sergio Pazzini, Solar Energy Materials & Solar Cells, 94 (2010) 1528-1533 ("As shown before, MG grade silicon is much too dirty to be employed for EG and PV applications."), and Solar Energy website of the U.S. Department of Energy: "to be useful as a semiconductor material in solar cells, silicon must be refined to a purity of 99.9999%." (Available at http://www1.eere.energy.gov/solar/silicon.html.) This is generally referred to as 6N, or solar grade silicon, SoG Si. Therefore, efforts have been made to produce what is referred to as "upgraded" metallurgical silicon (UMG silicon). However, to date, these efforts have not shown great success and come at high cost, especially for the high energy required for the "upgrade" process. Conversely, Sunpreme has shown that by using p-type doped MG silicon substrate and forming specific layers of amorphous silicon, a relatively cheap solar cell can be formed that has conversion efficiency higher than that of conventional thin-film solar cells.

The SmartSilicon solar cell is formed using a p-type MG silicon substrate 200, forming an amorphous intrinsic layer 205 on the top surface, forming an amorphous n-type layer 210 over the intrinsic layer 205, forming a TCO 215 over the n-layer. A back metallization layer is formed by depositing a titanium layer 230 over the entire back surface of the substrate 200, and depositing a layer of aluminum 235 over the titanium layer 230. The busbar 220 and fingers 225 are formed of silver, using the silk screen method. The Smart-Silicon cell's attractiveness is in its conversion efficiency being competitive with that of pure silicon solar cells, while using an extremely cheap MG silicon substrate. Consequently, the relative cost contribution of the silver metallization process to the cost of the entire cell increases.

While the solar industry embraces the silkscreen silver paste metallization process, the subject inventors have determined that there is a need to provide a cost-effective solution for busbar and finger metallization over a TCO, that is cheaper and more reliable than silkscreen silver paste, and that has lower resistivity than silver paste.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the subject invention provide methods for fabricating busbar and finger metallization over or together with a TCO. Rather than using expensive and relatively resistive silver paste, consisting of pure silver and glass frit with binders, with a resistivity of many times more than that for bulk Silver, embodiments of the invention utilize the high conductivity and relatively low cost copper (or alloys containing copper) deposited at room temperature, with a resistivity of around 2 μ Ohm cm. Various embodiments provide methods for enabling the use of copper as busbar and fingers over a TCO, providing good adhesion while preventing migration of the copper into the TCO. Also, provisions are made for easy soldering contacts to the copper busbars. The various embodiments of the invention can be applied to any solar cell structure that utilizes TCO, such as the HIT or the SmartSilicon. While embodiments of the invention are particularly beneficial for solar cells made of MG silicon, they can be applied to solar cells made on any substrate.

According to a further aspect of the invention, a solar cell is provided, comprising: a substrate having a back surface and a front surface, the front surface designed for facing the sun; a photovoltaic structure formed on the front surface; an ITO formed over the photovoltaic structure; and, front contacts formed over the ITO, the front contacts comprising busbars and fingers comprising copper. Instead of copper, an alloy comprising copper and other materials, such as, e.g., nickel and/or tin can be substituted.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate features of the exemplary embodiments in a diagrammatic manner. The drawings are not intended to depict every feature of actual embodiments nor relative dimensions of the depicted elements, and are not drawn to scale.

FIG. 3 illustrates a process according to an embodiment of the invention.

FIG. 4 illustrates the resulting structure of the process of FIG. 3.

FIG. 5 illustrates another process according to an embodiment of the invention.

FIG. 6 is a flow chart of another process according to an embodiment of the invention, while FIG. 7 illustrates a cross section of the progression of the resulting structure.

FIG. 8 is a flow chart of another process according to an embodiment of the invention, while

FIG. 10 illustrates another embodiment of the invention, while

FIG. 12 illustrates an embodiment of the invention with metallization before TCO process, while

FIG. 14 illustrates another embodiment of the invention with metallization before TCO process, while

FIG. 16 illustrates yet another embodiment of the invention with metallization before TCO process, while

DETAILED DESCRIPTION

Embodiments of the subject invention provide methods for manufacturing solar cells at reduced costs. Embodiments of the invention provide a lower cost alternative to silver metallization, which provide low resistivity—nearly ten times lower resistivity than silver paste based metallization—thereby enhancing current collection from the photovoltaic cell. Also, lower deposition temperatures of essentially room temperature in order to achieve the lower resistivities. Various methods are provided to increase adhesion and enable soldering to the busbars.

Figure 2:
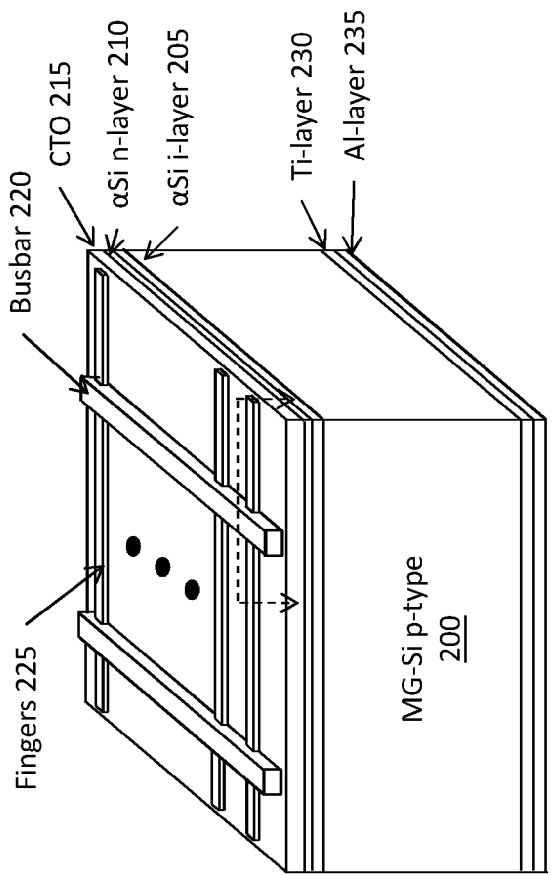
FIG. 2 illustrates a SmartSilicon® solar cell according to the prior art.
Figure 1:
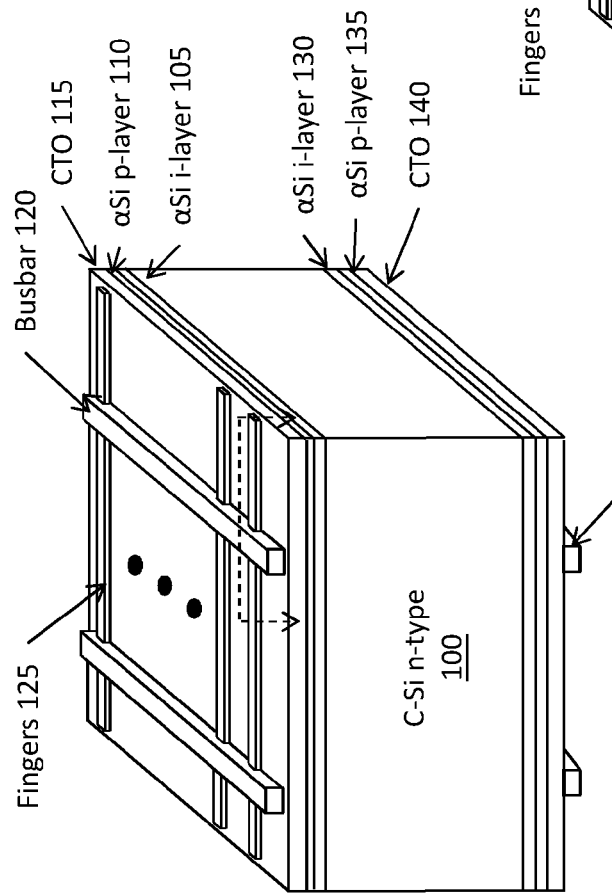
FIG. 1 illustrates a HIT solar cell according to the prior art.

FIG. 3 is a flowchart illustrating a process according to an embodiment of the invention, while FIG. 4 illustrates a cross-section of the resulting structure, exemplified by the broken-line arrow in FIGS. 1 and 2. In FIG. 3, the process starts after the photovoltaic (PV) cell 400 has been fabricated on a substrate and a TCO layer 405, e.g., an ITO has been deposited over the PV cell 400. The PV cell 400 may be any PV cell requiring a TCO as its top layer, for example, the HIT structure from Sanyo or the SmartSilicon structure from Sunpreme. In step 300, a mask 410 is formed over the TCO to delineate the design of the metallization. The mask may be, for example, a hot wax deposited using technique such as inkjet printing, or a resist material that can be cured via exposure to heat or certain illumination, e.g., UV curing, and being deposited using, e.g., the silkscreen technique. According to one embodiment, an inkjet system is used to deposit hot wax mask. Thereafter, the wax mask is reflowed by annealing the wafer, so as to provide enhanced coverage, especially when the surface of the wafer is textured.

Then, in step 305 a barrier/adhesion layer 415 is deposited. This layer is needed for two reasons. First, it is difficult to have copper adhere to TCO, especially to ITO. Second, copper tends to migrate and a study already showed that ITO is not a very good diffusion barrier to copper. The adhesion/barrier layer may be of a transition metal such as, e.g., chromium, nickel, titanium, etc. It may be deposited by, e.g., electroplating, electroless plating, PVD sputtering, etc. In step 310 copper layer 420 is plated over the barrier/adhesion layer 415. In this example the copper is plated using electroplating. In step 315 a cap layer 425 is formed over the copper 420. The cap layer 425 may be electroplated tin layer, which enables easy soldering onto the metallization layer, so as to connect a plurality of solar cells together, normally in a series connection. Alternatively, the barrier layer 415 may be sensitized by dipping in a liquid solution containing Pd++ (e.g. PdCl2) and then electrolessly plated with Copper. The final Ni layer is also electroless plated on top of the electroless Copper. Both electroless plating steps do not require an external field to be applied during the plating process.

FIG. 5 illustrates another process according to an embodiment of the invention. The process of FIG. 5 is similar to that of FIG. 3, except that a plasma treatment step has been added to the process flow. According to one embodiment, as shown in FIG. 5, the plasma treatment is performed after forming the mask 410. On the other hand, the plasma treatment may also be performed prior to forming the mask 410. In one embodiment the plasma treatment comprises a CH4 plasma formed in situ or using remote plasma source. The plasma treatment may be performed at elevated temperature, e.g. 100° C.-200° C. for, say, 5-20 minutes. The plasma treatment helps forming good adhesion to the TCO, especially when using electroplating to form the barrier/adhesion layer 415. The plasma treatment is used to reduce the TCO to enable better electroplating. In other embodiments, CH4/Ar or Ar/H2 plasma is used. According to yet another embodiment, an H2 plasma treatment is performed before the mask is formed.

FIG. 6 is a flow chart of another process according to an embodiment of the invention, while FIG. 7 illustrates a cross section of the progression of the resulting structure. As before, a PV solar cell 700 having a top TCO layer 705 is prepared for front surface metallization, i.e., fingers and busbars. The PV cell 700 is placed inside a PVD chamber having a target for a barrier/adhesion layer, e.g., nickel or titanium. For an improved adhesion, it is suggested that for this step a PVD chamber having a sputtering shutter be used. In step 600, the shutter is closed and plasma is ignited so as to treat the target by sputtering the target with plasma while the shutter is closed, so that no sputtered material reaches the PV cell. This can be a very short process, e.g., 2-10 minutes. At step 605 the shutter is opened and the plasma is maintained, so that an adhesion/barrier layer 710 is deposited on the TCO layer 705. The barrier layer can be 250-750 Å thick.

Step 610 is optional, but is shown in FIG. 6 in broken-line box and in FIG. 7 as part of the device for the completeness of illustration. In step 610 a seed copper layer 715 is deposited over the barrier/adhesion layer 605. In this embodiment the seed layer 715 is also PVD sputtered and can be very thin, e.g., 100-500 Å.

In step 615 a mask 720 is formed, e.g., using wax inkjet printing or photoresist silkscreen, so as to delineate the metallization design. The PV cell is then transferred to an electroplating system to electroplate copper layer 725. In step 625 a cap layer 730 is also electroplated over the copper layer 725. Here, the thickness of the cap layer is deposited thicker than the final desired thickness since, as will be shown later, part of this cap layer 730 will be removed during further processing. As before, the cap layer may be nickel, chromium, tin, etc. In step 630 the mask 720 is removed using proper solvent, depending on the type of mask material used. For example, a diluted mixture of KOH (less than 10%) can be used to remove wax or resist mask at room or elevated temperature (e.g., 50° C.). Then, a mixture of sodium persulfate or ammonium persulfate is used to remove the copper that was exposed when the mask was removed. Thereafter, a mixture of potassium permanganate is used to remove the part of the barrier/adhesion layer that was exposed by the removal of the copper. In this step, part of the cap layer may also be removed, which is why it is suggested to make the cap layer thicker than the desired final thickness. Also, in this step the potassium permanganate does not etch the TCO, so that in effect there is a natural etch stop when the barrier/adhesion layer is fully removed. In order to prevent any lateral etching of the barrier and seed layers, especially undercutting of the barrier layer underneath the copper fingers, the permanganate etching may be done with a jet spray to impart directionality to the etch, minimize isotropic etching resulting from immersing the wafer in a stationary liquid bath.

Figure 9:
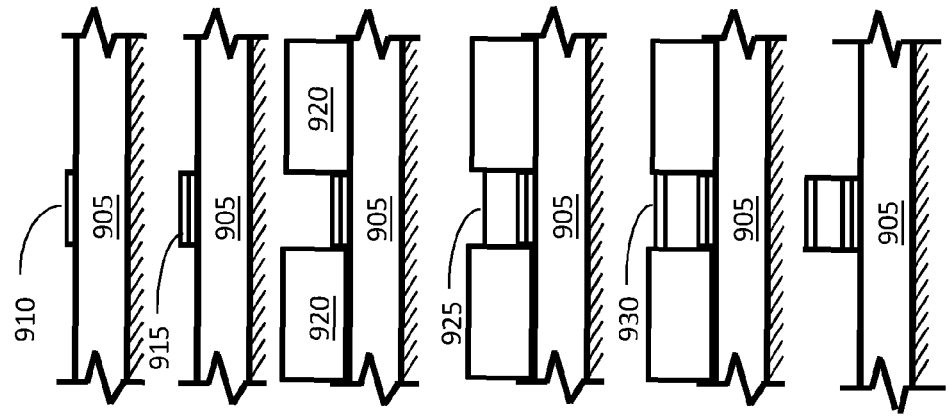
FIG. 9 illustrates a cross section of the progression of the resulting structure.
Figure 8:
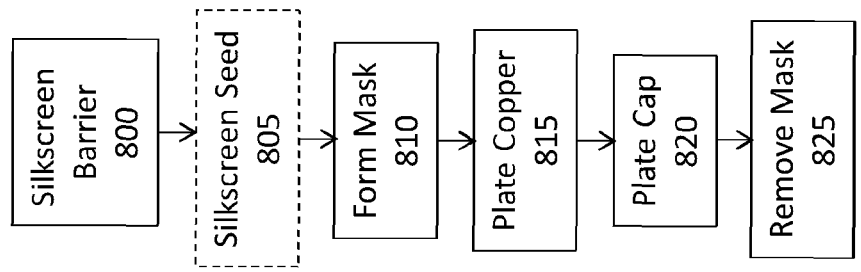

FIG. 8 is a flow chart of another process according to an embodiment of the invention, while FIG. 9 illustrates a cross section of the progression of the resulting structure. This embodiment utilizes conventional silkscreen technology together with plating technology. In step 800, a silkscreen system is used to deposit a barrier/adhesion layer 910 using, e.g., chromium paste, titanium paste, or standard silver paste. The deposited barrier/adhesion layer 910 is annealed at relatively low temperatures, such as 150°-250° C. In optional step 805 a seed layer 915 made of copper paste is deposited, also using silkscreen technique. Then, a mask 920 is formed in step 810, to delineate the design of the busbar and fingers. In this example, since the barrier/adhesion and seed layers were formed using silkscreen technology, it may be simpler to use silkscreen to also deposit a photoresist mask. At step 815 the wafer is taken to an electroplating system and electroplated with copper so as to form copper metallization layer 925. Thereafter in step 820 a cap layer 930 is deposited, also using electroplating. The mask 920 is then removed in step 825, so as to leave the metallization stack according to the mask design.

Figure 11:
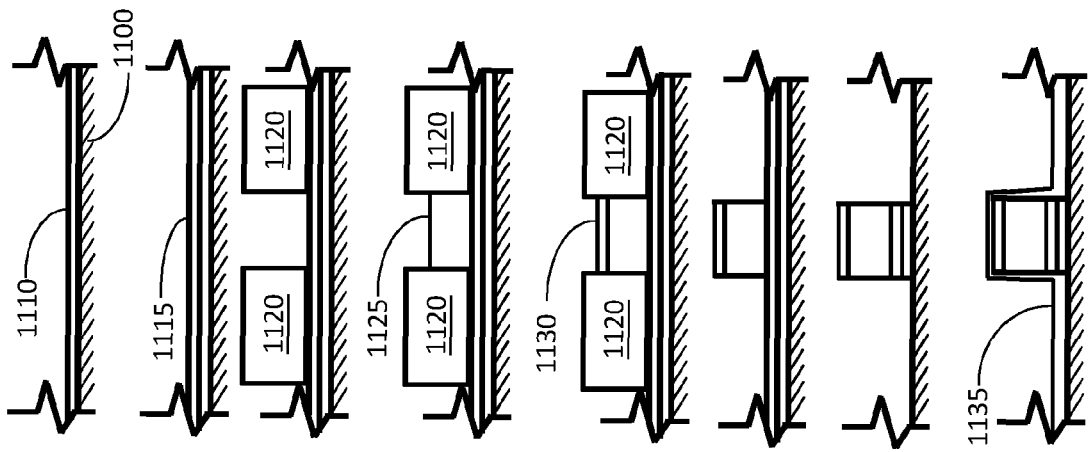
FIG. 11 illustrates a cross section of the progression of the resulting structure.
Figure 10:
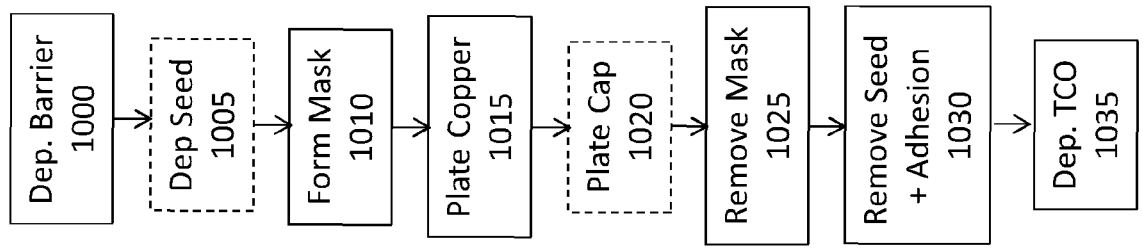

FIG. 10 illustrates another embodiment of the invention, while FIG. 11 illustrates a cross section of the progression of the resulting structure. In the embodiment of FIGS. 10 and 11, the process begins before the deposition of the TCO. As shown in FIGS. 10 and 11, in step 1000 a barrier/adhesion layer is first deposited over the top layer of the PV device. For example, in the HIT structure it will be deposited over the top p-type amorphous silicon layer 110, while in the SmartSilicon device it will be deposited over the top p-type amorphous silicon layer 210. This is illustrated in FIG. 11 as adhesion layer 1110 deposited over device layer 1100. In this embodiment, the adhesion layer is PVD sputtered metal, such as, e.g., titanium, tantalum, etc. In optional step 1005 a copper seed layer 1115 is PVD sputtered over the adhesion layer 1110. In step 1010 a mask 1120 is formed to delineate the design of the metallization. The mask may be inkjet wax, silkscreen photoresist, etc. In step 1015 the wafer is electroplated with copper, to form copper metallization 1125. In optional step 1020 a cap layer 1130 is electroplated over the copper layer 1125. In step 1025 the mask is removed and in step 1030 the seed and adhesion layers are removed as well. Note that in this step since the adhesion and seed layers are much thinner than the copper metallization layer 1125, it is very easy to etch them without harming the metallization layer 1125. Thus, the seed and adhesion layer can be removed in a diluted HF solution. Again, the use of directional wet etching using a jet spray will help prevent any undercutting. In step 1135 TCO is deposited over the entire substrate, thereby providing TCO over the top device layer 110, and also covering, and thereby protecting, the sidewall and the top of metallization 1125. Since the TCO provides protection over the metallization layer, step 1020 of depositing a cap layer may be dispensed with. Still, it is recommended to deposit a cap layer of easily solderable material, such as tin. This will enable easy soldering of the PV cell array. In this respect, it is noted that the TCO will need to be partially removed from the top of the busbars for soldering. This can be easily done with diluted HF.

For all of the above embodiments, when using electroplating, it is beneficial to prepare the surface of the TCO so that it is hydrophilic. This can be done by any of the following exemplary methods, or any combination thereof. According to one embodiment, the wafer with the ITO is rinsed in a "soap-like" solution to clean the surface of the TCO from any organic material. An example of such a solution may be the Micro-90, commercially available from Cole-Parmer of Vernon Hills, Ill. According to another embodiment, the surface of the TCO is treated with a surfactant. The surfactant treatment may be instead or in addition to the cleaning step. An example of surfactant may be a solution of sodium alkyl sulfates, mainly the lauryl, such as sodium dodecyl sulfate. According to another embodiment, the TCO is treated with UV light in an ozone atmosphere. This can be done at room or elevated temperature, e.g., 100°-200° C.

Figure 13:
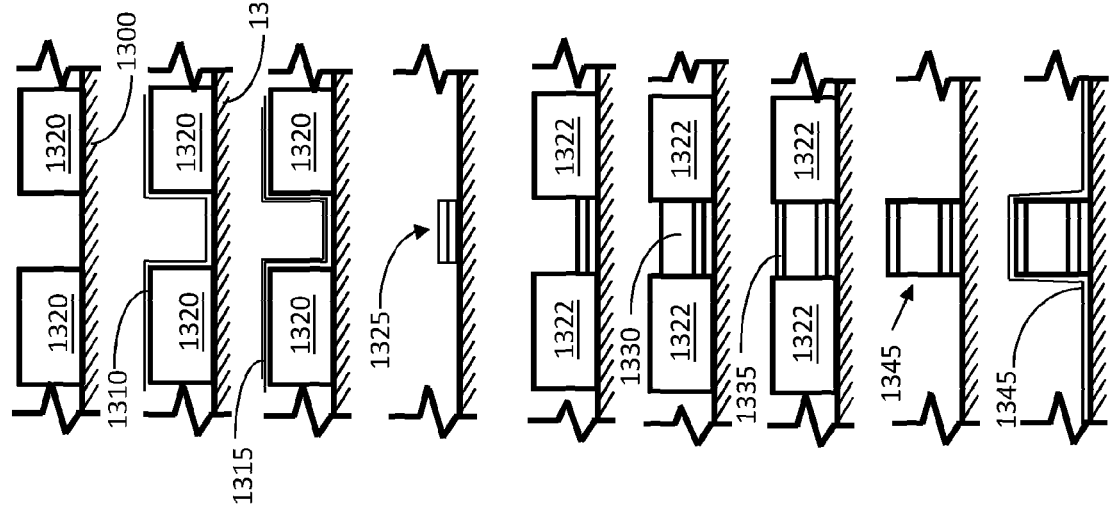
FIG. 13 illustrates a cross section of the progression of the resulting structure.
Figure 12:
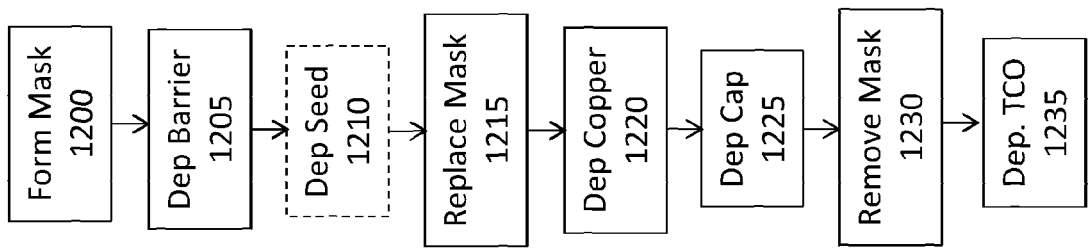

FIG. 12 illustrates an embodiment of the invention with metallization before TCO process, while FIG. 13 illustrates a cross section of the progression of the resulting structure. According to this embodiment, the metallization is fabricated first directly on the top layer 1300 of the photovoltaic device, and the TCO is fabricated later. In step 1200 a mask 1320 (FIG. 13) is formed over the top layer of the photovoltaic device to delineate the fingers and busbars. The top layer may be, e.g., the amorphous n-type or p-type silicon layer of the photovoltaic device junction. In step 1205 a barrier/adhesion layer 1310 is fabricated directly over the top device layer 1300, also somewhat covering the mask 1320. Optionally, in step 1210 a seed layer 1315 is fabricated over the barrier/adhesion layer. Then, in step 1215 the mask is replaced by first removing the mask 1320 so as to leave only metallization trace 1325, and then forming a new mask 1322. Then is step 1220 copper layer 1330 is formed by, e.g., electroplating. It should be noted that if electroplating is used, copper will be formed only where electrical potential is exposed, such that no copper will be formed over the mask. In step 1225 a cap layer 1335 is formed over the copper. Again, if electroplating is used, the cap layer will be formed only over the copper and not over the mask. Then is step 1230 the mask is removed, so as to leave only the metallization structure 1345. In step 1235 TCO is deposited over the entire wafer, thereby forming somewhat of an interdigit structure of the metallization a TCO over the top layer of the photovoltaic device. In this respect, it is possible to select the material of the cap layer such that TCO will not adhere to it. Regardless, the coverage of the stack 1345 by TCO is not detrimental and, in fact can be used as a good protection layer against oxidation of the stack.

Figure 15:
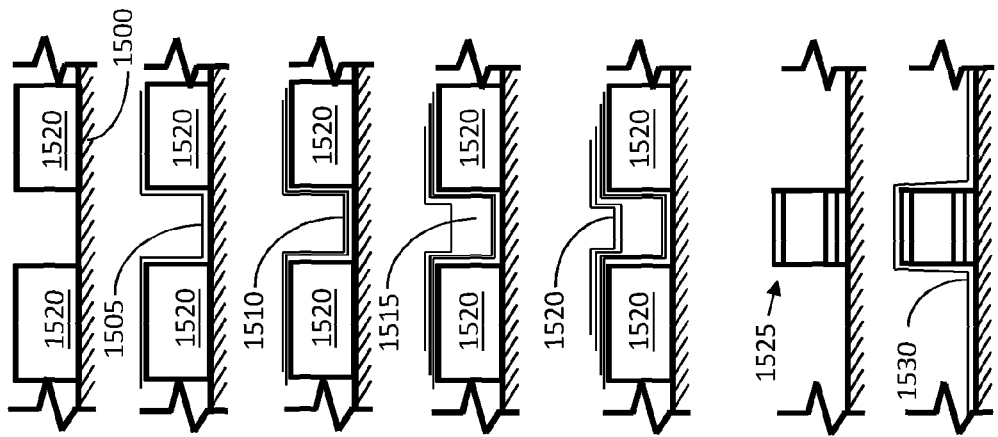
FIG. 15 illustrates a cross section of the progression of the resulting structure.
Figure 14:
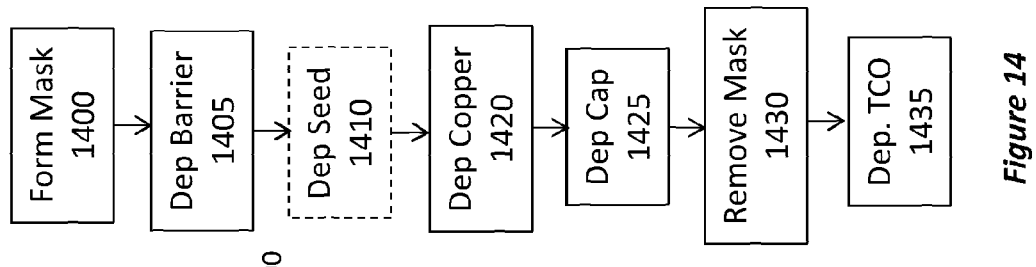

FIG. 14 illustrates another embodiment of the invention with metallization before TCO process, while FIG. 15 illustrates a cross section of the progression of the resulting structure. According to this embodiment, the metallization is fabricated first directly on the top layer 1500 of the photovoltaic device, and the TCO is fabricated later. In step 1400 a mask 1520 (FIG. 15) is formed over the top layer 1500 of the photovoltaic device to delineate the fingers and busbars. The top layer 1500 may be, e.g., the amorphous n-type or p-type silicon layer of the photovoltaic device junction. In step 1405 a barrier/adhesion layer 1505 is fabricated directly over the top device layer 1500, also somewhat covering the mask 1520. Optionally, in step 1410 a seed layer 1510 is fabricated over the barrier/adhesion layer. Then, in step 1420 copper layer 1515 is formed by, e.g., electroplating. In step 1425 a cap layer 1520 is formed over the copper. Then is step 1430 the mask is removed, so as to leave only the metallization structure 1525. In step 1435 TCO is deposited over the entire device. In this respect, it is possible to select the material of the cap layer such that TCO will not adhere to it. Regardless, the coverage of the stack 1525 by TCO is not detrimental and, in fact can be used as a good protection layer against oxidation of the stack.

Figure 17:
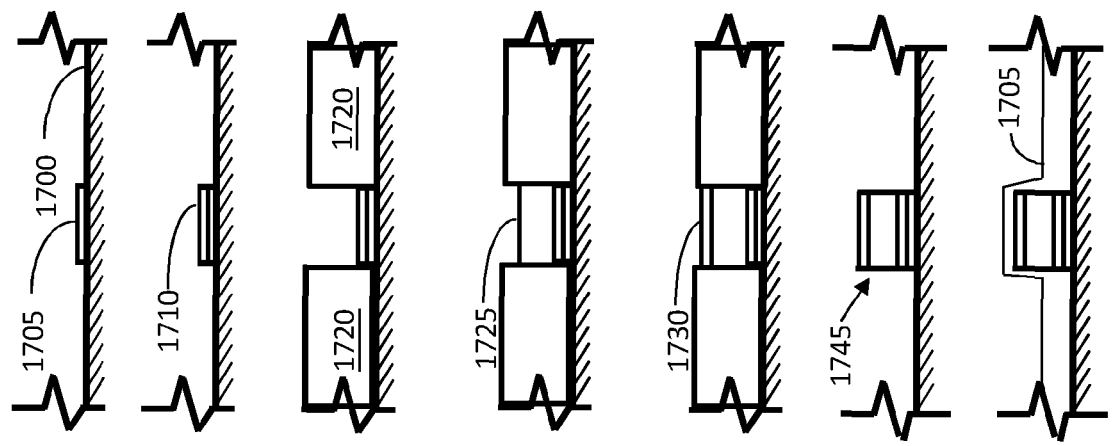
FIG. 17 illustrates a cross section of the progression of the resulting structure.
Figure 16:
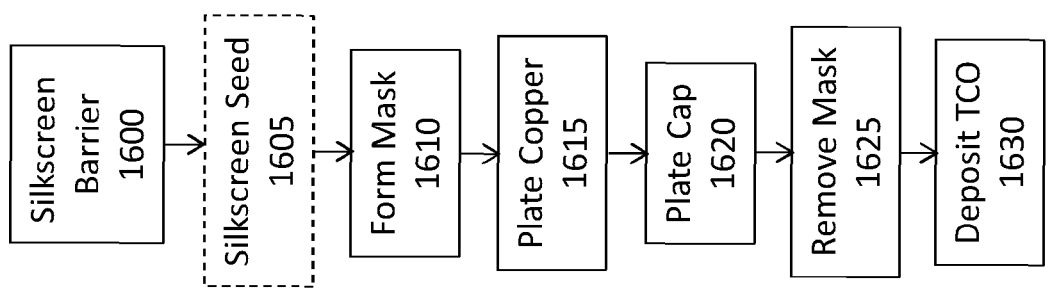

FIG. 16 illustrates yet another embodiment of the invention with metallization before TCO process, while FIG. 17 illustrates a cross section of the progression of the resulting structure. This embodiment utilizes conventional silkscreen technology together with plating technology, whereby the metallization is fabricated first directly on the top layer 1700 of the photovoltaic device, and the TCO is fabricated later. In step 1700, a silkscreen system is used to deposit a barrier/adhesion layer 1705 directly on the top device layer 1700, using, e.g., chromium paste, titanium paste, or standard silver paste. The deposited barrier/adhesion layer 1705 is annealed at relatively low temperatures, such as 150°-250° C. In optional step 1605 a seed layer 1710 made of copper paste is deposited, also using silkscreen technique. Then, a mask 1720 is formed in step 1610, to delineate the design of the busbar and fingers. In this example, since the barrier/adhesion and seed layers were formed using silkscreen technology, it may be simpler to use silkscreen to also deposit a photoresist mask. At step 1615 the wafer is taken to an electroplating system and electroplated with copper so as to form copper metallization layer 1725. Thereafter in step 1620 a cap layer 1730 is deposited, also using electroplating. The mask 1720 is then removed in step 1625, so as to leave the metallization stack 1745 according to the mask design. Then, in step 1630 a TCO layer 1705 is deposited over the entire device.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims. For example, the disclosure relates to using copper; however, it should be appreciated that an alloy comprising copper and other materials, such as, e.g., nickel and/or tin can be substituted.

The invention claimed is:

1. A method for fabricating a solar cell using a silicon wafer, comprising:
forming a front amorphous layer over front surface of the silicon wafer;
forming a front transparent conductive oxide (TCO) layer over the front amorphous layer;
forming a back amorphous layer over back surface of the silicon wafer;
forming a back transparent conductive oxide (TCO) layer over the front amorphous layer;
fabricating front metallization layer and a back metallization layer, by the steps of:
treating the TCO to become hydrophilic by rinsing the TCO with a solution of sodium alkyl sulfates;
forming a mask to delineate the metallization design;
sputtering a copper seed layer over the mask;
electroplating a copper layer or an alloy with 50% or more of copper over the copper seed layer; and,
removing the mask.

2. The method of claim 1, wherein forming the mask comprises forming a mask using photoresist.

3. The method of claim 1, wherein forming a front amorphous layer comprises forming an intrinsic amorphous layer directly over the front surface of the silicon wafer and forming an amorphous doped layer directly over the intrinsic amorphous layer.

4. The method of claim 3, wherein forming a back amorphous layer comprises forming a back intrinsic amorphous layer directly over the back surface of the silicon wafer and forming a back amorphous doped layer directly over the intrinsic amorphous layer.

5. The method of claim 1, wherein fabricating front metallization layer further comprises fabricating a cap layer over the copper layer.

6. The method of claim 5, wherein fabricating a cap layer comprises sputtering a metal layer.

7. The method of claim 1, wherein removing the mask comprises using solvent of diluted KOH.

8. The method of claim 2, wherein forming a mask comprises using silkscreen.

9. The method of claim 1, wherein fabricating front metallization layer further comprises depositing an adhesion layer prior to sputtering the seed layer.

10. The method of claim 9, further comprising:
depositing a barrier layer comprising one of chromium paste, titanium paste or silver paste; and,
annealing the barrier layer.

11. The method of claim 1, wherein treating the TCO to become hydrophilic further comprises rinsing the TCO with soap solution.

12. The method of claim 1, further comprising depositing a layer of at least one of nickel, chromium, and tin over the metallization copper layer.

13. The method of claim 3, wherein forming an amorphous doped layer comprises forming a p-type amorphous layer.

14. The method of claim 5, wherein fabricating a cap layer comprises electroplating a cap layer over the copper.

15. The method of claim 2, wherein forming a mask comprises using photoresist to delineate design of busbars and fingers.

16. The method of claim 1, wherein sputtering a copper seed layer comprises sputtering a design of busbars and fingers.

17. A method for fabricating a solar cell using a silicon wafer, comprising:
forming a front amorphous layer over front surface of the silicon wafer;
forming a front transparent conductive oxide (TCO) layer over the front amorphous layer;
forming a back amorphous layer over back surface of the silicon wafer;
forming a back transparent conductive oxide (TCO) layer over the front amorphous layer;
fabricating front metallization layer and a back metallization layer, by the steps of:
treating the TCO to become hydrophilic by exposing the front and back TCO to plasma having one of CH4/Ar, Ar/H2, or H2;
forming a mask to delineate the metallization design;
sputtering a copper seed layer over the mask;
electroplating a copper layer or an alloy with 50% or more of copper over the copper seed layer; and,
removing the mask.

18. The method of claim 17, wherein fabricating front metallization layer further comprises fabricating a cap layer over the copper layer.

19. A method for fabricating a solar cell using a silicon wafer, comprising:
forming a front amorphous layer over front surface of the silicon wafer;
forming a front transparent conductive oxide (TCO) layer over the front amorphous layer;
forming a back amorphous layer over back surface of the silicon wafer;
forming a back transparent conductive oxide (TCO) layer over the front amorphous layer;
fabricating front metallization layer and a back metallization layer, by the steps of:
treating the TCO to become hydrophilic by treating the TCO with UV light in an ozone atmosphere;
forming a mask to delineate the metallization design;
sputtering a copper seed layer over the mask;
electroplating a copper layer or an alloy with 50% or more of copper over the copper seed layer; and, removing the mask.

20. The method of claim 19, wherein treating the TCO is performed at temperature of 100°-200° C.

* * * * *